(12) United States Patent
Hellmark

(10) Patent No.: US 6,516,183 B1
(45) Date of Patent: Feb. 4, 2003

(54) METHOD AND APPARATUS FOR DISTURBANCE COMPENSATION OF A DIRECT CONVERSION RECEIVER IN A FULL DUPLEX TRANSCEIVER

(75) Inventor: Leif Martin Hellmark, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/393,887

(22) Filed: Sep. 10, 1999

(51) Int. Cl.[7] .................................................. H04B 1/44
(52) U.S. Cl. ............................ 455/78; 455/88; 455/296; 375/346
(58) Field of Search ............................... 455/78, 83, 88, 455/84, 24, 126, 295, 304, 307, 309; 375/346, 344, 345

(56) References Cited

U.S. PATENT DOCUMENTS 5,095,536 A * 3/1992 Loper ........................... 455/324
5,719,899 A * 2/1998 Thielecke et al. ............ 375/206
6,005,894 A * 12/1999 Kumar ......................... 375/270
6,278,864 B1 * 8/2001 Cummins et al. ............. 455/73
6,324,228 B1 * 11/2001 Millward et al. ........... 455/192.2

* cited by examiner

Primary Examiner—Thanh Cong Le
Assistant Examiner—Thuan T. Nguyen
(74) Attorney, Agent, or Firm—Burns, Doane, Swecker & Mathis, L.L.P.

(57) ABSTRACT

To address problems associated with interference in a received signal of a direct conversion receiver within a transceiver, an error estimator is employed to reduce errors induced on the baseband of the received signal. Knowledge that the transmitter within the transceiver is the strongest interferer can be used by the error estimator to subtract the interference caused by transmitter from the received signal. Additionally, this can be achieved even though the interference on the I and Q channels of the receiver is not equal.

16 Claims, 6 Drawing Sheets

METHOD AND APPARATUS FOR DISTURBANCE COMPENSATION OF A DIRECT CONVERSION RECEIVER IN A FULL DUPLEX TRANSCEIVER

BACKGROUND

The present invention generally relates to a full duplex transceiver in portable cellular phone systems, pager systems, etc., and more specifically to an error estimator which compensates for various disturbances caused to signals being received in a direct conversion receiver located within the transceiver.

Receivers in cellular systems and other fields noted above are preferably small, lightweight and inexpensive. To make a portable receiver such as a hand-held telephone smaller and less expensive, the integration of parts has become very important. Heterodyne receivers usually are of high cost to produce and have many parts such as bandpass filters that are unable to be integrated. To overcome such drawbacks, direct conversion receiver architecture has been developed in which the frequency of the local oscillator is the same as the frequency of the received radio carrier. Consequently, the received radio signal is down-converted directly to base band in one step. Since a direct-conversion receiver does not have any intermediate frequency (IF) stages, many filters can be omitted or simplified.

Direct conversion was introduced for single-sideband receivers in the 1950's, but the technique is not limited to such systems. Direct conversion can be used with many different modulation schemes and is especially well suited for the quadrature modulation schemes of today, such as minimum shift keying (MSK) and quadrature amplitude modulation (QAM). Various aspects of direct-conversion receivers are described in U.S. Pat. No. 5,530,929 entitled "Radio Receiver."

The operation of a conventional direct-conversion receiver can be described as follows with reference to FIG. 1. A radio frequency (RF) signal having center frequency $f_c$ and bandwidth $BW_{rf}$ is received by an antenna 10 and then is filtered by a bandpass filter 20. The filtered signal produced by the bandpass filter is amplified by an amplifier 30, which preferably has low noise to improve the total noise figure of the receiver.

The amplified and filtered signal produced by the amplifier 30 is then down-converted to base band in an in-phase (I) channel and a quadrature phase (Q) channel by balanced mixers 40, 50. The mixers are driven by respective ones of sine (I) and cosine (Q) signals, produced from a sinusoidal signal generated by a local oscillator 60, by a suitable divider and phase shifter 70. According to the direct-conversion principle, the local oscillator signal also has the frequency $f_c$.

The mixers 40, 50 effectively multiply the signal from the amplifier 30 and the I and Q signals of the local oscillator. Each mixer produces a signal that has frequencies that are the sum and difference of the frequencies of the amplified filtered received signal and the local oscillator signal. The difference (down-converted) signals each have a spectrum that is folded over around zero frequency (DC) and that spans from DC to $\frac{1}{2}BW_{rf}$.

The I and Q signals produced by the mixers 40, 50 are filtered by low-pass filters 80, 90 that remove the sum (up-converted) signals, as well as components that might be due to nearby RF signals. The filters 80, 90 set the noise bandwidth, and thus, the total noise power in the receiver. The I and Q signals are then amplified by amplifiers 100, 110, and provided to further processing components that produce the demodulated output signal. The further processing can include phase demodulation, amplitude demodulation, frequency demodulation, or hybrid demodulation schemes.

One major problem with the direct-conversion receiver is that baseband signal distortion can be caused by a pure DC signal generated by local oscillator leakage, in addition to second-order products of interferers (e.g., signals on the same and nearby RF communication channels) produced by active elements located close to the receiver. The distortions, located at the base band, interfere with the desired base band signal, thereby degrading performance of a direct conversion receiver. In some situations, this problem totally blocks communication in high-performance receivers for today's time division multiple access (TDMA) and wide band code division multiple access (WCDMA) digital cellular systems.

A second order non-linearity together with a strong constant envelope RF interferer will cause a DC component within a received signal. Such a DC component can be blocked, for example, with a DC blocking capacitor.

Amplitude Modulated (AM) interferers, however, present a larger problem since the disturbance at baseband will not be a pure DC signal and therefore cannot be easily removed. In non-linear devices such as an amplifier, an input signal, $V_{in}$, will produce an output signal, $V_{out}$. The characteristics of an amplifier located within a transceiver can be defined as $V_{out}=c_1V_{in}+c_2V_{in}^2+c_3V_{in}^3+\ldots$, where an input signal can be $V_{in}(t)=v_1(t)\cdot\cos(\omega_1 t)$. If the input signal is applied to the input of the amplifier, the output is described by the following equation:

$$v_{out}(t) = \frac{1}{2}c_2 v_1^2(t) + \left(c_1 v_1(t) + \frac{3}{4}c_3 v_1^3(t)\right)\cos\omega_1 t + \qquad (1)$$
$$\frac{1}{2}c_2 v_1^2(t)\cos 2\omega_1 t + \frac{1}{4}c_3 v_1^3 \cos 3\omega_1 t + \ldots$$

From this equation it can be seen that the input signal will generate a baseband distortion component described by:

$$v_{bb}(t) = \frac{1}{2}c_2 v_1^2(t), \qquad (2)$$

where constant $c_2$ depends on a second order intercept point of the amplifier. The second order intercept point is determined by applying two signals at two different frequencies, $f_1$ and $f_2$, to the amplifier. The output power, $P_{out}$, is plotted at the first frequency, the sum of the first and second frequency against the input power $P_{in}$ of either $f_1$ or $f_2$. Extrapolation of $P_{out}$ versus $P_{in}$ of either $f_1$ or $f_2$ yields the second order intercept point. If $V_{iIP2}$ is the voltage input of the amplifier at the second order intercept point, the baseband voltage can be written as:

$$v_{bb}(t) = \frac{1}{2}\frac{c_1}{V_{iIP2}}v_1^2(t). \qquad (3)$$

In an application which consists of both I and Q modulators the interference problem can be described with reference to FIG. 2. An interfering signal, IF, is an AM modulated signal that generates baseband interference in both the Q and I channels, where $$V_{bbI}(t) = K_i \cdot v_1^2(t)$$

$$V_{bbQ}(t) = K_q \cdot v_1^2(t), \quad (4)$$

and $K_i$ and $K_q$ are constants. The disturbance on the I and Q channels, however, is not necessarily equal, due to the differing levels of interfering signals on the channels, and the different components in the IQ demodulator. The resulting signal is an error signal that is combined with the desired signal. The error signal can be written as:

$$\epsilon_i(t) = K_i \cdot v_1^2(t)$$

$$\epsilon_q(t) = K_q \cdot v_1^2(t), \quad (5)$$

The AM interferer together with second order nonlinearities in the receiver generate a baseband error vector. The phase of the error vector is constant, or varies slightly, and the magnitude is proportional to the squared envelope of the interferer. Since the disturbance is not necessarily equal on I and Q channels, $K_i$ is not necessarily equal to $K_q$ in the general case. Accordingly, the error signal can be written as:

$$\epsilon(t) = \epsilon_i(t) + j\epsilon_q(t) = r_\epsilon(t)e^{j\gamma}, \quad (6)$$

where $$r_\epsilon(t) = K_y \cdot v_1^2(t)$$

$$K_y = |K_i + jK_q|$$

and $$\delta = arg(K_i + jK_q) \quad (7)$$

where $\gamma$ is an arbitrary phase shift that is constant or changes slightly with, for example, a temperature variation.

As discussed above, in the case where the input has a constant envelope, the baseband interference will be a pure DC component. The offset caused by a pure DC component can be compensated for, in the simplest case, by a DC blocking capacitor or as described in U.S. Pat. No. 5,241, 702 to Dent. Compensating for a constant RF interference, however, is more complex. For example, if the transceiver is of full duplex type (i.e., transmitting and receiving at the same time) the transmitted signal can be a very strong interferer of the receiver.

Generally, the amplitude of the input signal will be a function of time. The interference will therefore also be a function of time. In U.S. Pat. No. 5,579,347 by Lindquist et al., two methods of removing interference from amplitude modulated (AM) interferers are described.

First, a switched interferer, such as a GSM signal, causes a DC step once every time the power is turned on and off. For a GSM interferer, this occurs once every time slot (e.g., approximately 600 us). The method described by Lindquist removes the DC step caused by a switched interferer. However, the method operates in a system where the interfering DC step occurs once every slot which is a limitation that does not address the general case where the interferer is amplitude modulated.

There have also been several other techniques employed to handle this problem. For example, the transceiver can employ duplex filters. These filters are bulky and have stringent requirements with respect to attenuation of the transmitter in the receive path. The transmitter and receiver can also be separated by large distances and isolated by shielding in order to reduce interference. Additionally, the transceiver can be employed with extremely linear, and therefore current consuming, amplifiers in the receiver.

These techniques reduce the efficiency of the transceiver so much that using direct conversion receivers in full duplex transceiver has not been considered practical. However, systems based on full duplex transceivers are becoming more and more common with the requirement for high bit rates increasing. For example, when utilizing wide band CDMA, such transceivers are in demand. In wide band CDMA; the receiver-transmitter band separation is large (e.g., 130 MHz) which makes the use of a direct conversion receiver more feasible. Therefore, what is needed is the ability to efficiently compensate for disturbances within a direct conversion receiver in a full duplex phone.

SUMMARY

To solve the problems associated with disturbance caused by AM interferers and nonlinearities in direct conversion receiver within a transceiver, an error estimator is employed to reduce errors induced on the baseband of the received signal. Knowledge that the transmitter within the transceiver is the strongest interferer to signals being received by that transceiver can be used by the error estimator to subtract the interference caused by transmitter from the received signal. Additionally, this can be achieved even though the interference on the I and Q channels of the receiver is not equal.

In exemplary embodiments of the present invention direct conversion methods and apparatuses are described, including: transmitting signals via the transceiver, receiving input signals at the transceiver, wherein the input signals include desired signals in combination with interfering signals, determining a time delay associated with the interfering signals and correcting, after the time delay, the input signals to compensate for the interfering signals.

In another exemplary embodiment of the present invention correction of interference between a transmitter and receiver, in a transceiver, is described including: a calculation unit for determining a squared envelope signals transmitted by the transmitter, a synchronization unit for determining a time delay associated with reception of the squared envelope by the receiver, a delay unit for applying a time delay to the squared envelope, and an estimator and scaling unit for determining a compensation value to apply to the receiver based on the time delayed, squared envelope.

In yet other exemplary embodiments transceivers used for signal transmission and reception are described which include: a direct conversion receiver for receiving an incoming signal and downconverting the signal into a baseband signal, a transmitter which receives data to be transmitted and modulates the data for transmission to a destination and an error correction device for utilizing the modulated data of the transmitter and a time delay indicating the amount of time necessary for a transmitted signal to interfere with the receiver to compensate the receiver.

DRAWINGS

Other objects and advantages of the present invention will become more apparent from the following detailed description when read in conjunction with the accompanying drawings, wherein like elements have been represented by like reference numerals and wherein.

DETAILED DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

The exemplary radio communication systems discussed herein are described as using the code division multiple access (CDMA) protocol, in which communication between the base station and the mobile terminals is performed over a number of time slots. However, those skilled in the art will appreciate that the concepts disclosed herein find use in other protocols, including, but not limited to, frequency division multiple access (FDMA), time division multiple access (TDMA), or some hybrid of any of the above protocols. Likewise, some of the exemplary embodiments provide illustrative examples relating to the GSM system, however, the techniques described herein are equally applicable to base and mobile stations operating in any system.

Figure 1:
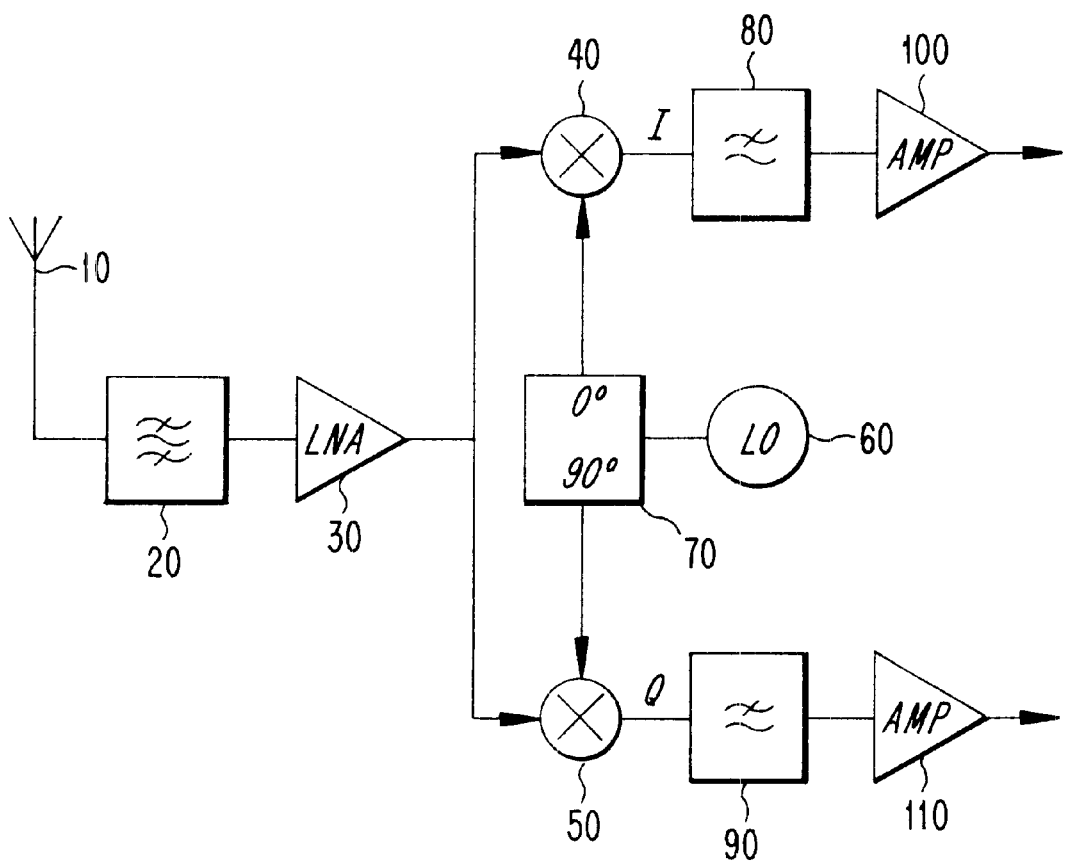
FIG. 1 illustrates a block diagram of a direct conversion receiver.
Figure 2:
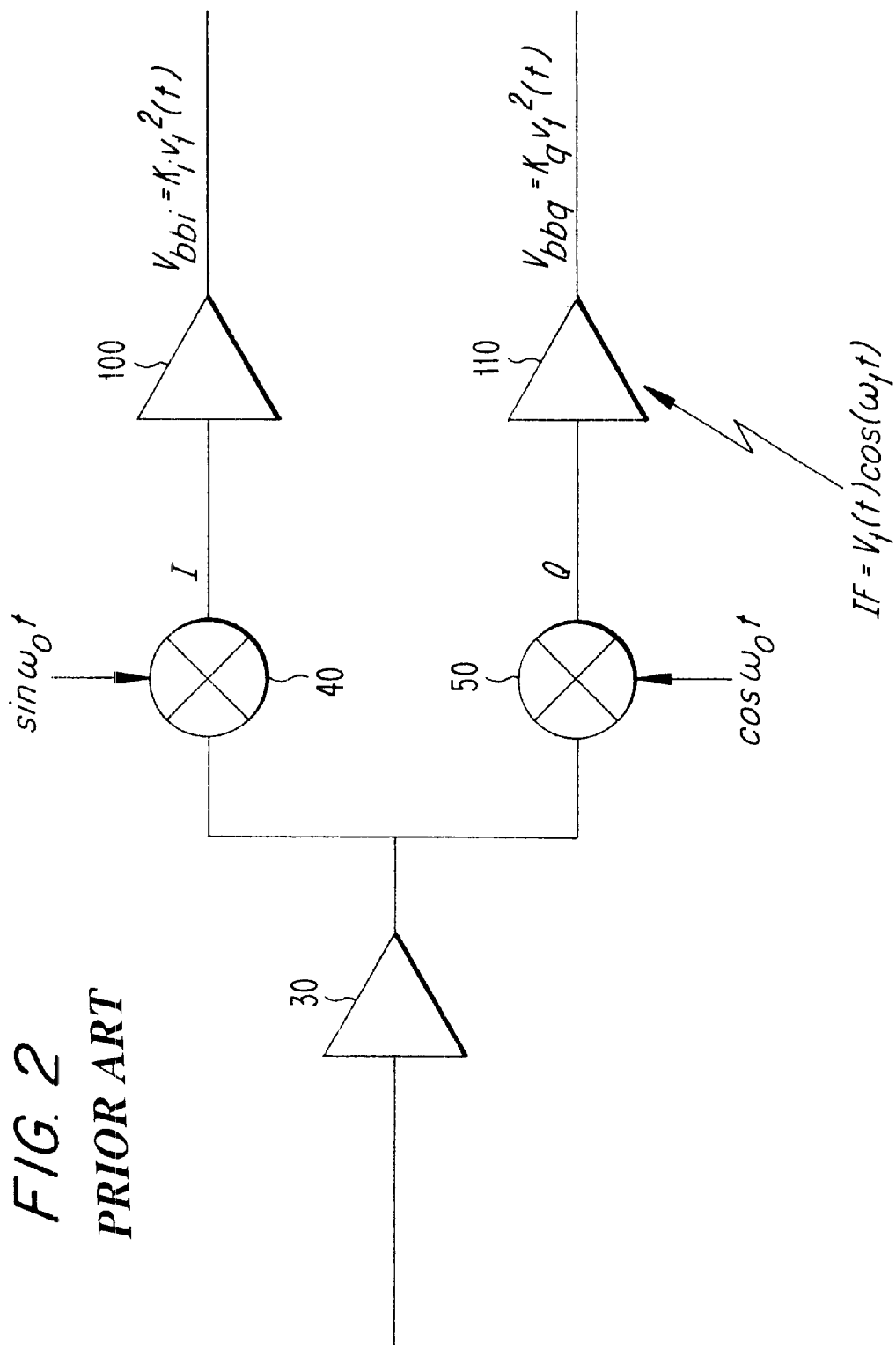
FIG. 2 illustrates the effect of interference on a direct conversion receiver.
Figure 3:
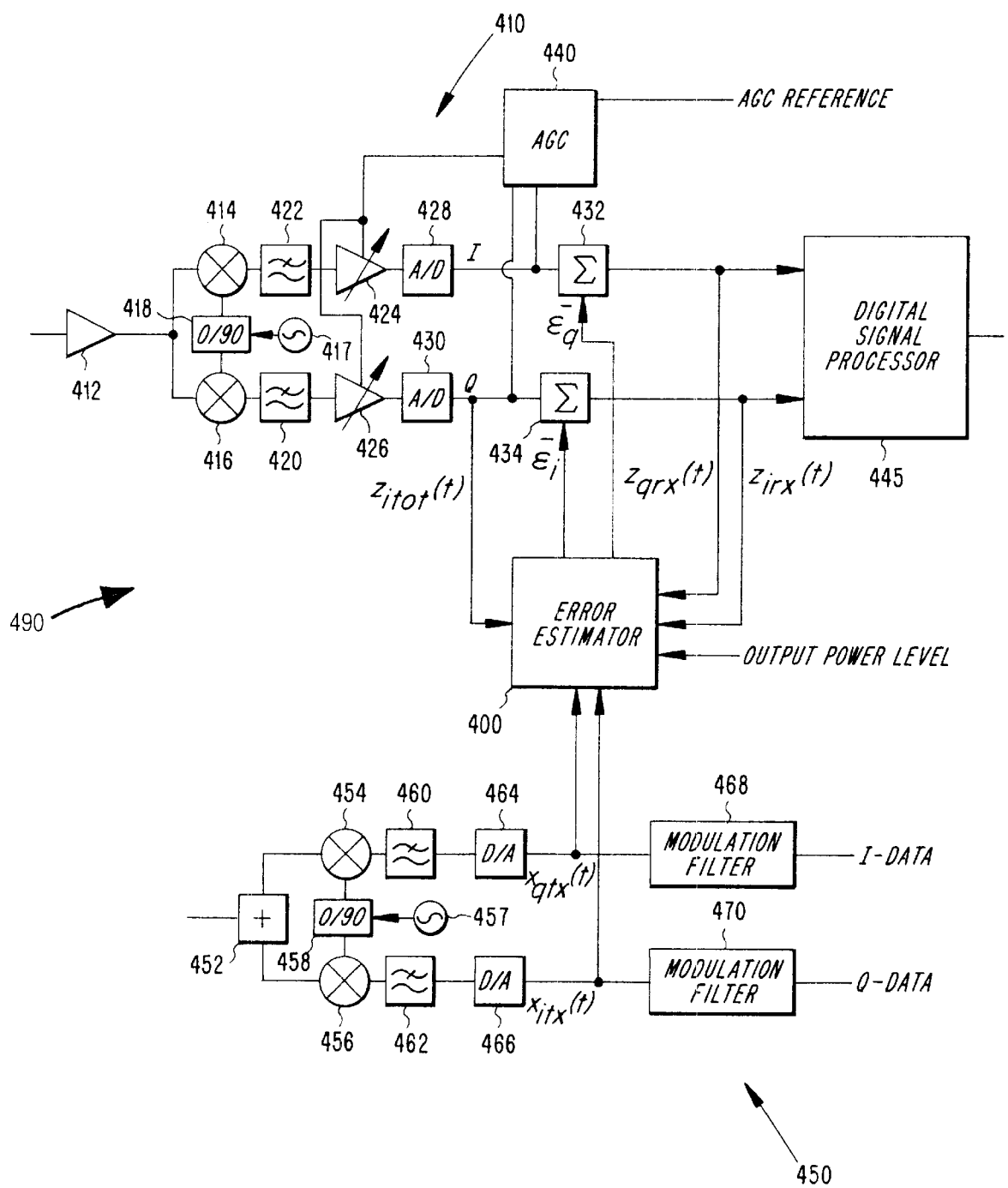
FIG. 3 illustrates a block diagram of a transceiver and error estimator in accordance with an exemplary embodiment of the present invention.

A detailed block diagram of a transceiver 490 is illustrated in FIG. 3 in accordance with an exemplary embodiment of the present invention. The receiver 410 of the transceiver 490 receives a signal via an antenna (not shown) and is filtered by a bandpass filter (not shown). The filtered signal produced by the bandpass filter is amplified by an amplifier 412, which preferably has low noise to improve the signal-to-noise ratio of the receiver 410.

The amplified and filtered signal produced by the amplifier 412 is down-converted to base band in-phase (I) and quadrature phase (Q) channels by balanced mixers 414 and 416. The mixers are driven by respective ones of sine (I) and cosine (Q) signals produced from a sinusoidal-signal generated by a local oscillator 417 by a suitable divider and phase shifter 418. The mixers 414, 416 effectively multiply the signal from the amplifier 412 and the I and Q signals of the local oscillator. Each mixer produces a signal that has frequencies that are the sum and difference of the frequencies of the amplified filtered received signal and the local oscillator signal.

The I and Q signals produced by the mixers are filtered by low-pass filters 420 and 422 that remove up-converted signals, as well as components due to nearby RF signals. The filters 420 and 422 set the noise bandwidth and thus the total noise power in the receiver 410. The I and Q signals are then amplified by variable amplifiers 424 and 426, and sent to analog-to-digital converters 428 and 430. The gain of variable amplifiers 424 and 426 is determined by the total input signal level of the receiver 410. In accordance with the present invention, the output of the analog-to-digital (A/D) converters 428 and 430 is sent via combiners 432 and 434 (combining the A/D converters' outputs with an output from an error estimator 400) to a digital signal processor 445 for further processing. The digital signal processor 445 can perform Viterbi equalization, RAKE signal processing, amplitude and phase demodulation, etc. Additionally, the output of the A/D converters 428 and 430 is sent to an automatic gain controller 440 (AGC) and to the error estimator 400. The AGC 440 is used to determine the gain of the amplifiers 424 and 426.

The transmitter 450 of the transceiver 490 receives I data and Q data on separate channels and filters the data via modulation filters 468 and 470. The output of the modulation filters 468 and 470 are input directly to the error estimator 400 and to digital-to-analog (D/A) converters 464, 466 in the transmitter. The data is sent through filters 460, 462 and through mixers 454, 456. The mixers are driven by respective ones of sine (I) and cosine (Q) components produced from a sinusoidal signal generated by a local oscillator 457 in conjunction with a suitable divider and phase shifter 458. The mixed signals are then combined via combiner 452 and transmitted via an antenna (not shown) to a destination.

Figure 4:
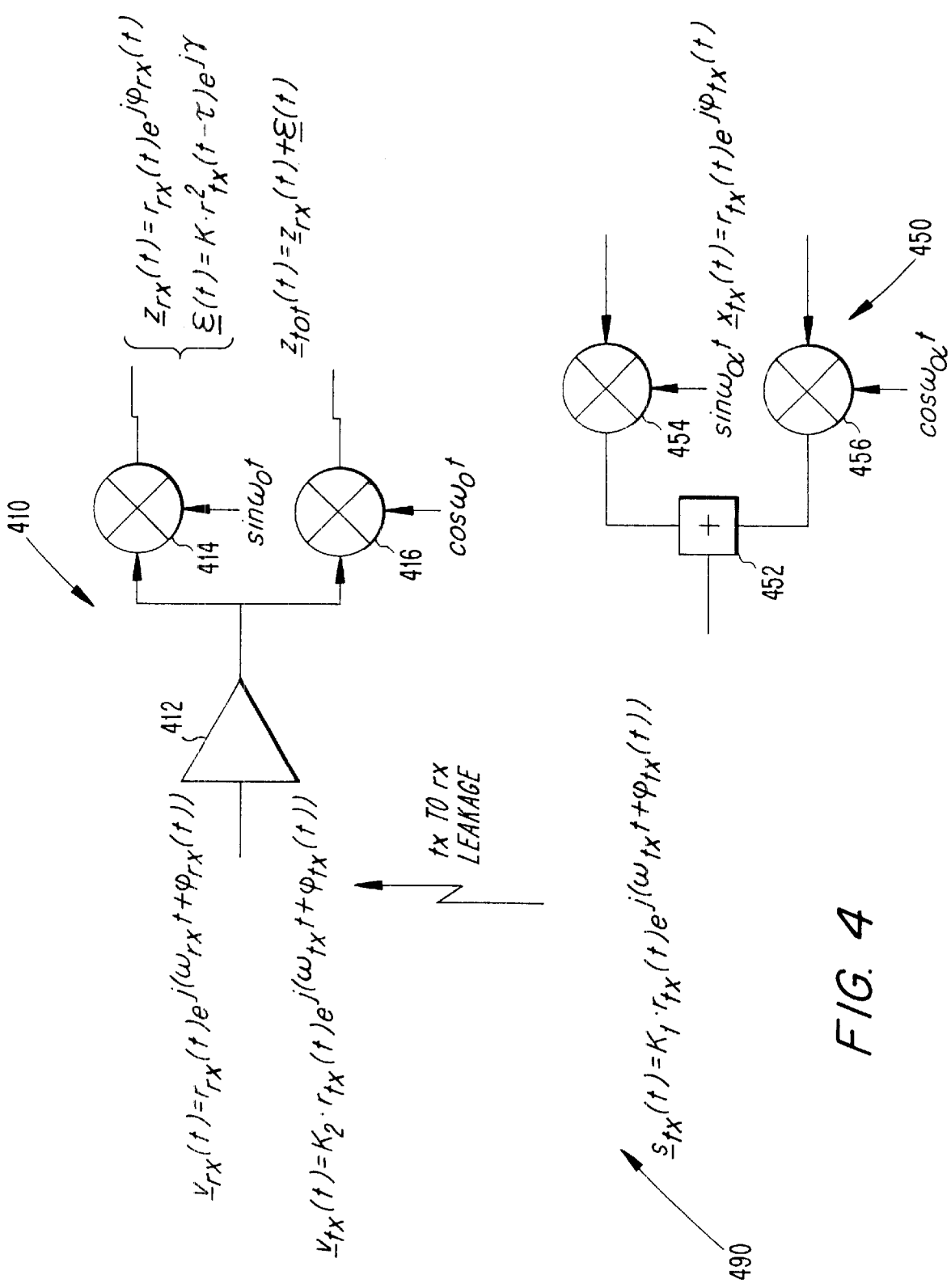
FIG. 4 illustrates a block diagram of a partial view of the transceiver of the present invention.

When a transceiver is employed in a mobile station, as shown in FIG. 3, signal distortion of received signals is caused by signals being transmitted by the same transceiver. FIG. 4 shows a partial view of the transceiver 490 shown in FIG. 3, which details the signal interaction between the receiver 410 and the transmitter 450 of the transceiver 490. Signal $v_{rx}(t)$, received at the receiver 410 is the desired signal to be received from a base station, for example. Signal $s_{tx}(t)$ represents the transmitted signal at the transmitter 450, while $v_{tx}(t)$ represents the interfering signal at the receiver 410 caused by the transmission of signal $v_{tx}(t)$. The desired baseband signal is $z_{rx}(t)$, $\epsilon(t)$ represents the baseband error vector caused by the interfering signal, $v_{tx}$ and $Z_{tot}(t)$ represents their sum. Signal $x_{tx}(t)$ represents the baseband signal to be transmitted by the transmitter 450. Constants K, $K_1$ and $K_2$ shown in the equations are proportionality values, and $\tau$ is the time delay from the baseband waveform generator (not shown) to the receiver 410.

Figure 5:
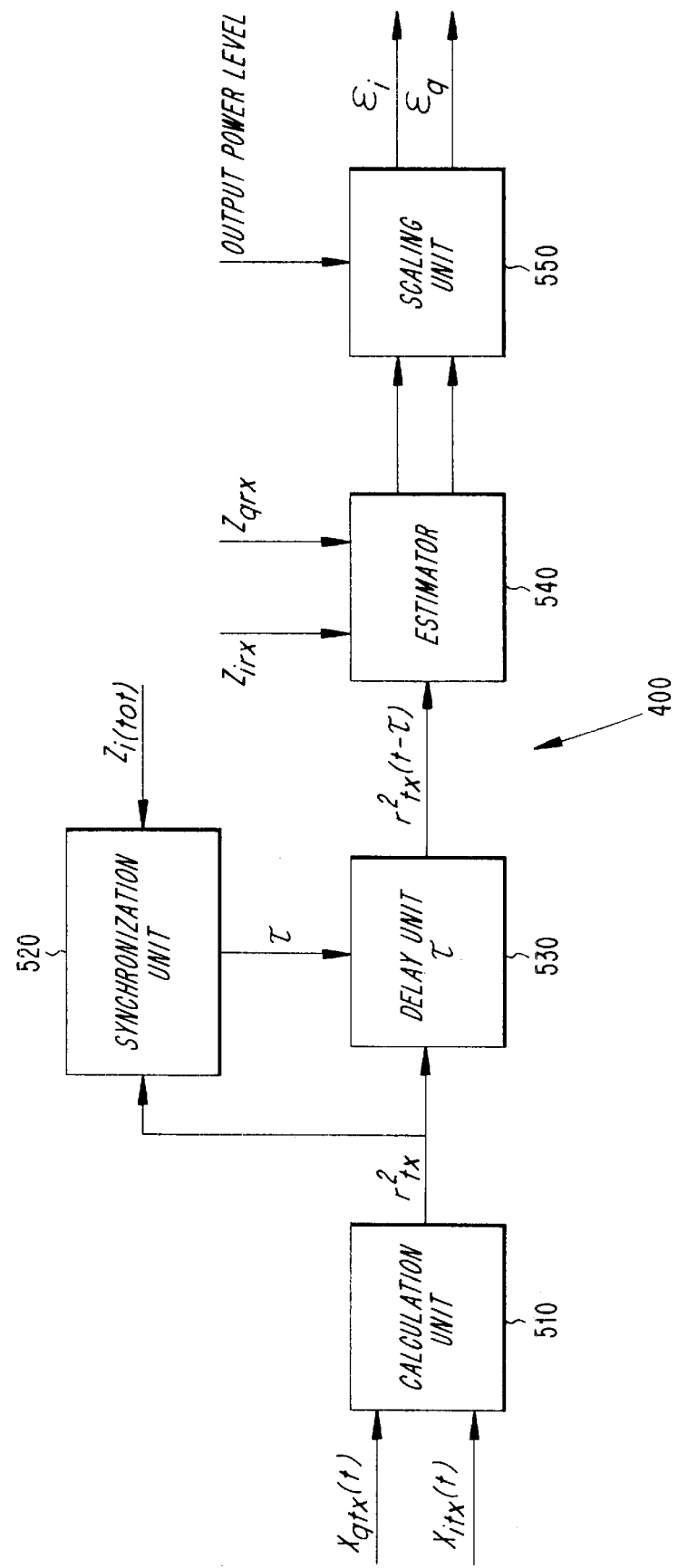
FIG. 5 illustrates a detailed block diagram of the error estimator in accordance with an exemplary embodiment of the present invention.

The error estimator 400 of the present invention, illustrated in detail in the block diagram of FIG. 5, relies on the fact that the signal output at the transmitter 450 is the strongest interfering signal. Since the transmitted signal is determined to be the strongest interfering signal, an error signal derived from the transmitted waveform can be subtracted from the received signal. As described with respect to FIG. 3, the error estimator 400 uses a plurality of inputs from both the receiver 410 and transmitter 450 of the transceiver 490 to compensate for distortion in the base band of the receiver. Constants $K_i$ and $K_q$ need to be determined in order to calculate the error values $\epsilon_i$ and $\epsilon_q$ as shown above in equation 5. Since constants $K_i$ and $K_q$ change slowly, it is possible to continually recalculate the error values in order to reduce the error in the received signal. The error values are determined and subtracted from the received signal at combiners 432 and 434.

As shown in FIG. 5, the error estimator 400 receives output from the modulation filters 468 and 470 on the I and Q channels of the transmitter 450. The outputs are received at calculation unit 510, then squared and added to determine a squared envelope of the transmitter 450, $r^2_{tx}(t)$. Those skilled in the art will appreciate that the squared envelope may be calculated or approximated using other techniques. Since there will be some delay between the time at which the disturbing signals are generated by the transmitter and the time at which they propagate into the receive chain, this value is sent to a synchronization unit 520 to determine the delay in transmission of the disturbing signal to the receiver 410. The time delay, τ, to be applied to the squared envelope signal, is determined in the synchronization unit 520 by correlation of $r^2_{tx}(t)$ with either the I or Q component of the received baseband signal $Z_{i(tot)}$ (t). Referring back to FIG. 3, the I channel baseband signals are shown as being used by the error estimator 400. However, one of ordinary skill in the art will recognize that the Q channel baseband signals could also be used.

Once the time delay, τ, is determined via correlation, it is applied to the squared envelope of the transmitter, $r^2_{tx}(t)$, by the delay unit 530. The delayed signal is then applied to the estimator 540 which determines the values of $\epsilon_i$ and $\epsilon_q$. The values of $K_i$ and $K_q$ are first determined before determining the error signals. However, due to the fact that $K_i$ and $K_q$ are slowly changing constants, it is possible to recalculate these constants without affecting the output of the error estimator 400.

Figure 6:
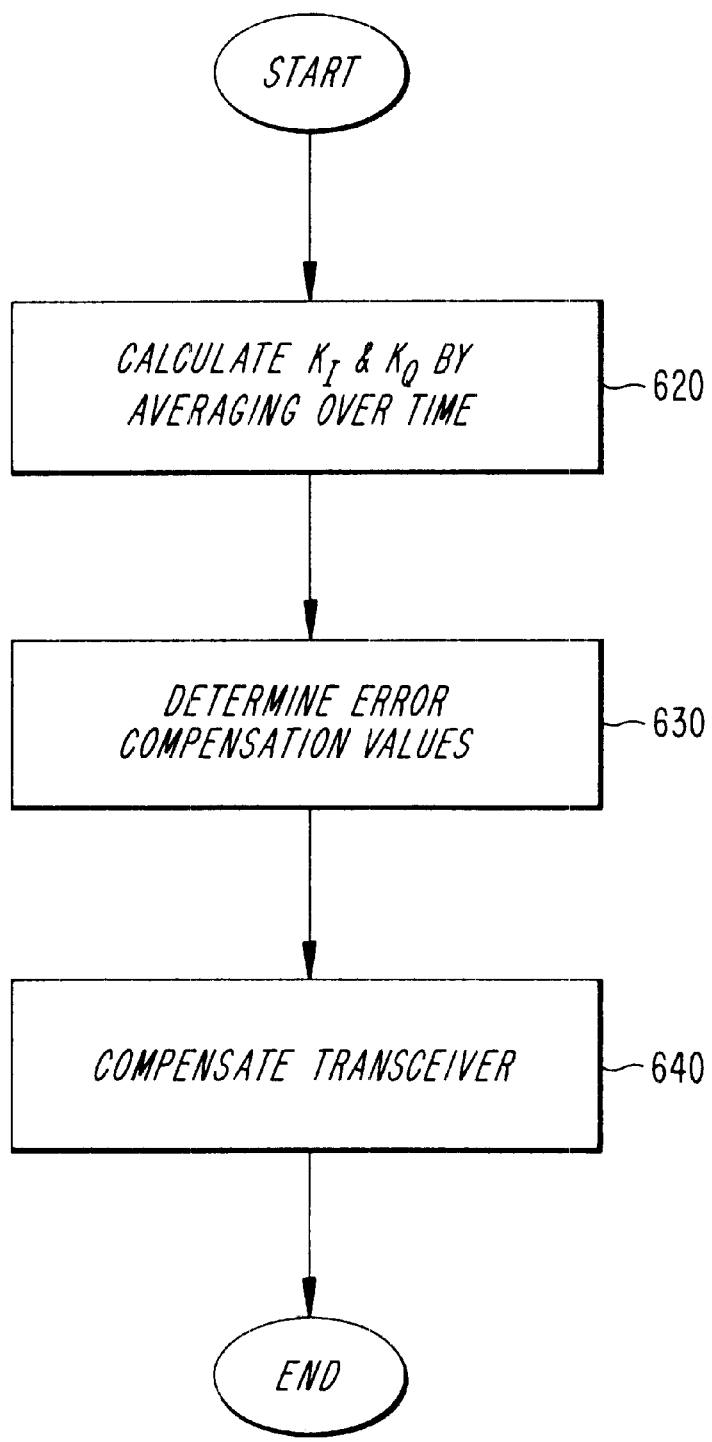
FIG. 6 illustrates a flow diagram of the error correction compensation routine in accordance with the present invention.

FIG. 6 depicts an exemplary method for compensating a transceiver according to the present invention. First, at step 620, the values of Ki and Kq are determined. This can be accomplished, for example, as described below with respect to equations (8)–(12). Consider that the total input signal received by the receiver 410 can be described as:

$$Z_{tot} = Z_{rx} + K r_{tx}^2(t-\tau) e^{iy} \qquad (8)$$

As a result, the I component (imaginary part) of the total input signal received by the receiver 410 is:

$$Z_{i(tot)}(t) = Z_{irx} + K_i r_{tx}^2(t-\tau) \qquad (9)$$

where $Z_{i(tot)}(t)$ is the known actual input signal received by the receiver and $r_{tx}^2(t-\tau)$ is the known transmitted signal that has been time shifted. Accordingly, knowledge of $Z_{irx}$ (imaginary component of the desired baseband signal) would make it possible to solve for $K_i$.

Since any data information source can be described as a random process, all symbols have an equal probability. If either the imaginary or real value is averaged, the result will be zero since the probability distribution is symmetrical. Accordingly, the following equation reflects that the average of the desired received signals I and Q components is zero:

$$\frac{1}{N} \sum_{k=1}^{N} Z_{irx}(k) = 0 \qquad (10)$$

Equations (9) and (10) shown above for the imaginary part of the input signal received can also be calculated for the real part of the input signal received. Constants $K_i$ and $K_q$ can then be estimated by averaging over a sufficient number of samples N such that $Z_{irx}$ and $Z_{qrx}$ can be assumed to be zero, as shown in the equations below:

$$K_i = \frac{\sum_{k=1}^{N} z_{i(tot)}(k)}{\sum_{k=1}^{N} r_{tx}^2(k-n)} \qquad (11)$$

$$K_q = \frac{\sum_{k=1}^{N} z_{q(tot)}(k)}{\sum_{k=1}^{N} r_{tx}^2(k-n)}, \qquad (12)$$

It is important that the output power is constant during the calculation of $K_i$ and $K_q$. Returning now to the flowchart of FIG. 6, in step 630, once $K_i$ and $K_q$ are found, the error compensation values can be estimated. Before being used to compensate the received signal, however, the output power level is used to scale the values $\epsilon_i$ and $\epsilon_q$ through use of a scaling unit 550 (shown in FIG. 5).

In step 640, the transceiver is compensated through the use of the estimated values error values, obtained in step 630. For example, once $K_i$ and $K_q$ have been determined, every subsequently received signal sample can be compensated by:

$$z_{rx}(k) = z_{tot}(k) - \underline{\epsilon}(k). \qquad (13)$$

While the present invention has been described with respect to its preferred embodiment, those skilled in the art will recognize that the present invention not limited to the specific embodiment described and illustrated herein. Different embodiments and adaptations besides those shown herein and described as well as many variations, modifications and equivalent arrangements will now be apparent or will be reasonably suggested by the foregoing specification and drawings without departing from the substance of the scope of the invention.

What is claimed is:

1. A method for compensating for disturbances in a signal received by a transceiver, caused by transmissions generated by said transceiver, comprising the steps of:

transmitting signals via a transmitter of said transceiver;

receiving input signals via a receiver of said transceiver, wherein said input signals include desired signals in combination with interfering signals, and wherein said interfering signals include signals transmitted via the transmitter;

determining a time delay associated with the transmission of said interfering signals by said transmitter; and correcting, after said time delay, said input signals to compensate for the interfering signals.

2. The method of claim 1, wherein said time delay is determined in accordance with a length of time a signal takes to be transmitted from said transmitter to said receiver.

3. The method of claim 1, wherein said correcting comprises subtracting an estimated error from said received input signal.

4. The method of claim 1, wherein said step of determining a time delay further comprises the step of:

synchronizing at least one signal sequence transmitted by said transmitter with one signal sequence received by the receiver.

5. An apparatus for compensating for disturbances in a signal received by a transceiver, caused by transmissions generated by said transceiver, said transceiver comprising:

transmitter means for transmitting signals;

receiving means for receiving input signals, wherein said input signals include desired signals in combination with interfering signals, and wherein said interfering signals include signals transmitted from the transmitter means;

determining means for determining a time delay associated with the transmission of said interfering signals by said transmitter means; and correcting means for correcting, after said time delay, said input signals to compensate for the interfering signals.

6. The apparatus of claim 5, wherein said time delay is determined in accordance with a length of time a signal takes to be transmitted from said transmitter means to said receiver means.

7. The apparatus of claim 5, wherein said correcting means further comprises:

subtracting means for subtracting an estimated error from said received input signal.

8. The apparatus of claim 5, wherein said determining means further comprises:

synchronizing means for synchronizing at least one signal sequence transmitted by said transmitter means with one signal sequence received by the receiver means.

9. A correction unit for correcting for interference between a transmitter and receiver, in a transceiver, said correction unit comprising:

a calculation unit for determining a squared envelope of signals transmitted by said transmitter;

a synchronization unit for determining a time delay associated with reception of said squared envelope by said receiver;

a delay unit for applying said time delay to the squared envelope; and an estimator and scaling unit for determining a compensation value to apply to said receiver based on said time delayed, squared envelope.

10. The correction unit of claim 9, wherein said synchronization unit receives a baseband signal from said receiver and said squared envelope signal of said transmitter and performs a correlation routine.

11. A transceiver used for signal transmission and reception, comprising:

a direct conversion receiver for receiving an incoming signal and downconverting said signal into a baseband signal;

a transmitter which receives data to be transmitted and modulates said data for transmission to a destination; and an error correction unit for utilizing said modulated data of said transmitter and a time delay indicating the amount of time necessary for a transmitted signal from said transmitter to interfere with said receiver to compensate said receiver.

12. The transceiver of claim 11, wherein said error correction unit further comprises:

a calculation unit which uses said modulated data of said transmitter to calculate and output a signal representing a squared envelope of the transmitter.

13. The transceiver of claim 12, wherein said error correction unit further comprises:

a synchronization unit which receives the output of said calculation unit and determines and outputs said time delay to a delay unit.

14. The transceiver of claim 13, wherein said delay unit applies said time delay to the signal representing a squared envelope of the transmitter.

15. The transceiver of claim 14, wherein said error correction unit further comprises:

an estimator that determines a set of constants as follows:

$$K_i = \frac{\sum_{k=1}^{N} z_{i(tot)}(k)}{\sum_{k=1}^{N} r_{tx}^2(k-n)}$$

$$K_q = \frac{\sum_{k=1}^{N} z_{q(tot)}(k)}{\sum_{k=1}^{N} r_{tx}^2(k-n)},$$

where $z_{irx}(k)$ and $z_{qrx}(k)$ are desired baseband vectors, $r^2_{tx}(k-n)$ is the squared envelope of said transmitter and n is the time delay, and wherein said estimator determines error values to compensate said receiver based upon said set of constants.

16. The transceiver of claim 15, wherein said error correction unit further comprises:

a scaling unit which, utilizing an output power level of said transceiver scales said error values before being used to compensate said receiver.

* * * * *